United States Patent
Choi et al.

(10) Patent No.: US 10,134,991 B2
(45) Date of Patent: Nov. 20, 2018

(54) ORGANIC LIGHT-EMITTING DISPLAY APPARATUS AND METHOD OF MANUFACTURING THE SAME

(71) Applicant: Samsung Display Co., Ltd, Yongin-si, Gyeonggi-do (KR)

(72) Inventors: Jinbaek Choi, Yongin-si (KR); Younggil Kwon, Yongin-si (KR); Seul Lee, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/438,511

(22) Filed: Feb. 21, 2017

(65) Prior Publication Data
US 2017/0250344 A1  Aug. 31, 2017

(30) Foreign Application Priority Data
Feb. 29, 2016 (KR) .................. 10-2016-0024720

(51) Int. Cl.
| | | |
|---|---|---|
| *H01L 51/00* | (2006.01) | |
| *H01L 51/52* | (2006.01) | |
| *H01L 51/56* | (2006.01) | |
| *H01L 27/32* | (2006.01) | |

(52) U.S. Cl.
CPC ...... *H01L 51/0016* (2013.01); *H01L 27/3246* (2013.01); *H01L 51/0023* (2013.01); *H01L 51/5228* (2013.01); *H01L 51/5259* (2013.01); *H01L 51/56* (2013.01)

(58) Field of Classification Search
None
See application file for complete search history.

(56) References Cited

U.S. PATENT DOCUMENTS

| | | | | |
|---|---|---|---|---|
| 2008/0203898 A1* | 8/2008 | Kobayashi | .......... | H01L 51/5265 313/498 |
| 2010/0141136 A1* | 6/2010 | Yoo | .......... | H01L 51/5259 313/553 |
| 2013/0236999 A1 | 9/2013 | Lee et al. | | |
| 2014/0248565 A1 | 9/2014 | Defranco et al. | | |
| 2015/0034923 A1* | 2/2015 | Kim | .......... | H01L 51/5044 257/40 |
| 2017/0222147 A1* | 8/2017 | Defranco | .......... | H01L 51/0016 257/40 |
| 2017/0222148 A1* | 8/2017 | Defranco | .......... | H01L 51/0018 430/314 |

FOREIGN PATENT DOCUMENTS

| | | |
|---|---|---|
| JP | 2002-170669 A | 6/2002 |
| JP | 2008-85200 A | 4/2008 |
| WO | 2013/074617 A1 | 5/2013 |
| WO | 2013/074622 A1 | 5/2013 |

* cited by examiner

*Primary Examiner* — Jay C Chang
(74) *Attorney, Agent, or Firm* — Innovation Counsel LLP

(57) ABSTRACT

A method of manufacturing an organic light-emitting display apparatus includes forming a first lift-off layer comprising fluoropolymer and a moisture absorbent over a substrate comprising a first electrode; forming a photoresist over the first lift-off layer and patterning the photoresist by removing a part of the photoresist; etching the first lift-off layer in a region from which the part of the photoresist has been removed by using a first solvent to expose the first electrode; forming an organic functional layer comprising an emission layer above the first electrode and above the first lift-off layer; removing the first lift-off layer by using a second solvent; and forming a second electrode over the organic functional layer.

19 Claims, 20 Drawing Sheets

ORGANIC LIGHT-EMITTING DISPLAY APPARATUS AND METHOD OF MANUFACTURING THE SAME

CROSS-REFERENCE TO RELATED APPLICATION

This application claims the benefit of Korean Patent Application No. 10-2016-0024720, filed on Feb. 29, 2016, in the Korean Intellectual Property Office, the disclosure of which is incorporated herein in its entirety by reference.

BACKGROUND

1. Field

One or more embodiments relate to an organic light-emitting display apparatus and a method of manufacturing an organic light-emitting display apparatus.

2. Description of the Related Art

An organic light-emitting display apparatus includes a hole injection electrode, an electron injection electrode, and an organic emission layer between the hole injection electrode and the electron injection electrode. The organic light-emitting display apparatus is a self-emissive display apparatus, in which holes injected from the hole injection electrode and electrons injected from the electron injection electrode recombine in the organic emission layer and distinguish to emit light. The organic light-emitting display apparatus is considered as a next generation display apparatus owing to its high quality characteristics such as low power consumption, high brightness, and fast response speeds.

SUMMARY

One or more embodiments include an organic light-emitting display apparatus and a method of manufacturing the organic light-emitting display apparatus, capable of reducing defects and manufacturing costs.

Additional aspects will be set forth in part in the description which follows and, in part, will be apparent from the description, or may be learned by practice of the presented embodiments.

According to one or more embodiments, a method of manufacturing an organic light-emitting display apparatus includes forming a first lift-off layer comprising fluoropolymer and a moisture absorbent over a substrate comprising a first electrode; forming a photoresist over the first lift-off layer and patterning the photoresist by removing a part of the photoresist; etching the first lift-off layer in a region from which the part of the photoresist has been removed by using a first solvent to expose the first electrode; forming an organic functional layer comprising an emission layer above the first electrode and above the first lift-off layer; removing the first lift-off layer by using a second solvent; and forming a second electrode over the organic functional layer.

The fluoropolymer may include a content of fluorine ranging from about 20 wt % to about 60 wt %.

The organic functional layer may further include at least one of a hole injection layer, a hole transport layer, an electron transport layer, and an electron injection layer.

The organic functional layer may be formed through a deposition process.

The patterning by removing the part of the photoresist may be performed through a photolithography process.

The first solvent may include fluorine.

The second solvent may include fluorine.

After the etching the first lift-off layer in the region from which the photoresist has been removed, the first lift-off layer may form an undercut profile under a region in which the photoresist remains.

The method may further include forming a pixel defining layer that surrounds an edge of the first electrode.

The method may further include forming a second lift-off layer comprising fluoropolymer between the first lift-off layer and the first electrode.

The method may further include: forming a third lift-off layer comprising fluoropolymer and a moisture absorbent between the second lift-off layer and the first electrode.

The method may further include forming an auxiliary cathode in the forming of the organic functional layer before forming the second electrode.

According to one or more embodiments, a method of manufacturing an organic light-emitting display apparatus includes forming a plurality of first electrodes over a substrate and performing a first unit process comprising following operations (a1) through (e1), (a1) forming a first lift-off layer comprising fluoropolymer over the substrate comprising the plurality of first electrodes; (b1) forming a photoresist over the first lift-off layer and patterning the photoresist by removing a part of the photoresist; (c1) etching the first lift-off layer in a region from which the photoresist has been removed by using a first solvent to expose a predetermined first electrode selected from the plurality of first electrodes; (d1) forming a first organic functional layer comprising an emission layer above the predetermined first electrode and above the first lift-off layer; (e1) removing the first lift-off layer by using a second solvent. After performing the first unit process, the method further includes performing a second unit process comprising following operations (a2) through (e2) at least one time; (a2) forming a second lift-off layer comprising fluoropolymer and a moisture absorbent over the substrate comprising the plurality of first electrodes; (b2) forming a photoresist over the second lift-off layer and patterning the photoresist by removing a part of the photoresist; (c2) etching the second lift-off layer in a region from which the photoresist has been removed by using the first solvent to expose a first electrode different from the predetermined first electrode selected during the first unit process; (d2) forming a second organic functional layer comprising an emission layer above the first electrode and above the second lift-off layer; (e2) removing the second lift-off layer by using the second solvent. After performing the first unit process and the second unit process, the method further includes forming a second electrode.

Light emitted from the first and second organic functional layers respectively formed during the first unit process and the second unit process may be mixed to generate white light.

The method may further include during the second unit process, forming a third lift-off layer comprising fluoropolymer between the second lift-off layer and the first organic functional layer.

The method may further include during the second unit process, forming a fourth lift-off layer comprising fluoropolymer and a moisture absorbent between the third lift-off layer and the first organic functional layer.

The second electrode may be integrally formed on the first and second organic functional layers as a common electrode.

The method may further include forming an auxiliary cathode in the forming of the first and second organic functional layer of the first and second unit process before forming the second electrode.

The method may further include forming a pixel defining layer that surrounds an edge of the first electrode.

According to one or more embodiments, an organic light-emitting display apparatus is manufactured by using the above-described method.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
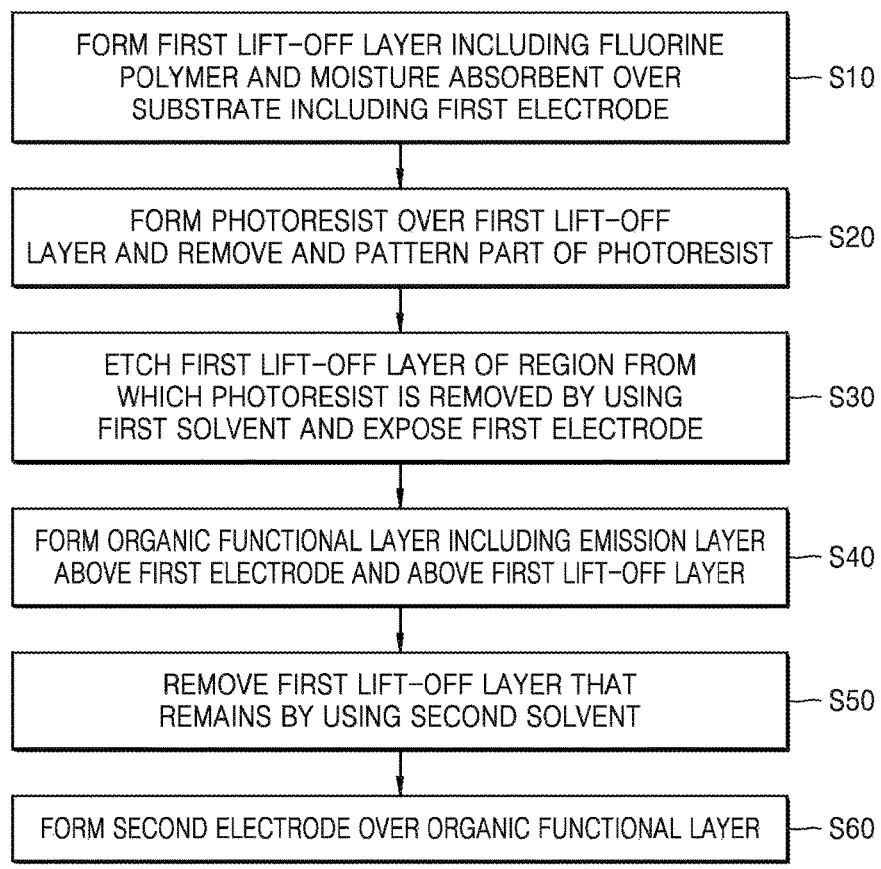
FIG. 1 is a flowchart of a method of manufacturing an organic light-emitting display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, the inventive concept will be described in detail by explaining embodiments of the inventive concept with reference to the attached drawings. Like reference numerals in the drawings denote like elements.

It will be understood that although the terms "first," "second," etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

Sizes of components in the drawings may be exaggerated for convenience of explanation. In other words, since sizes and thicknesses of components in the drawings are arbitrarily illustrated for convenience of explanation, the following embodiments are not limited thereto.

FIG. 1 is a flowchart of a method of manufacturing an organic light-emitting display apparatus 1 according to an embodiment.

Referring to FIG. 1, the method of manufacturing the organic light-emitting display apparatus 1 includes forming a first lift-off layer including a fluorine polymer and a moisture absorbent over a substrate including a first electrode (operation S10), forming a photoresist over the first lift-off layer and removing and patterning a part of the photoresist (operation S20), etching the first lift-off layer of a region from which the photoresist is removed by using a first solvent and exposing the first electrode (operation S30), forming an organic functional layer including an emission layer above the first electrode and above the first lift-off layer (operation S40), removing the first lift-off layer that remains by using a second solvent (operation S50), and forming a second electrode over the organic functional layer (operation S60).

The method of manufacturing the organic light-emitting display apparatus 1 and the organic light-emitting display apparatus 1 manufactured by the method according to an embodiment will be described in detail with reference to FIGS. 2 through 6F.

Figure 2:
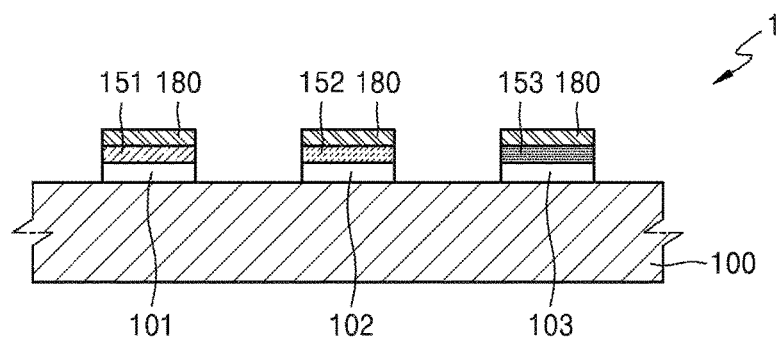
FIG. 2 is a schematic cross-sectional view of an organic light-emitting display apparatus manufactured by using a method according to an embodiment.
Figure 3:
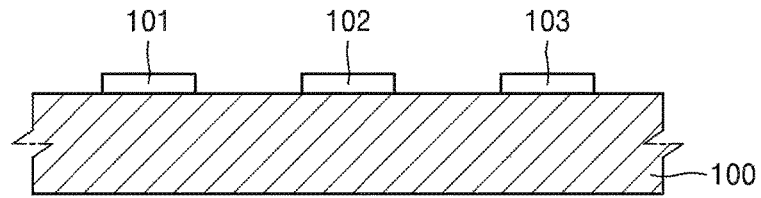
FIG. 3 is a schematic cross-sectional view showing a plurality of anodes formed over a substrate by using the method according to an embodiment.

FIG. 2 is a schematic cross-sectional view of the organic light-emitting display apparatus 1 manufactured by using a method according to an embodiment. FIG. 3 is a schematic cross-sectional view showing a plurality of anodes formed over a substrate by using the method according to an embodiment. FIGS. 4A through 4F are schematic cross-sectional views for describing a first unit process of the method according to an embodiment. FIGS. 5A through 5F are schematic cross-sectional views for describing a second unit process of the method according to an embodiment. FIGS. 6A through 6F are schematic cross-sectional views for describing a third unit process of the method according to an embodiment.

Referring to FIG. 2, the organic light-emitting display apparatus 1 manufactured by the method according to an embodiment may include a plurality of anodes including a first anode 101, a second anode 102, and a third anode 103 over a substrate 100. First through third organic functional layers 151, 152, and 153 each including an emission layer may be located respectively over the first through third anodes 101, 102, and 103.

Referring to FIG. 3, the plurality of anodes including the first anode 101, the second anode 102, and the third anode 103 may be formed over the substrate 100.

The substrate 100 may include various materials. For example, the substrate 100 may include a glass material or a plastic material. The plastic material may include a material having excellent heat-resisting property and durability such as polyimide, polyethylenenaphthalate, polyethyleneterephthalate, polyarylate, polycarbonate, polyetherlmide, polyethersulfone, or etc.

Although not shown in FIG. 3, a buffer layer (not shown) for providing a flat surface above the substrate 100 and preventing impurity elements from infiltrating into the substrate 100 may be further provided. The buffer layer (not shown) may have a single-layered structure or a multi-layered structure including silicon nitride and/or silicon oxide.

The first through third anodes 101, 102, and 103 may be hole injection electrodes and may include a material having a high work function. The first through third anodes 101, 102, and 103 may each include at least one selected from the group consisting of indium tin oxide, indium zinc oxide, zinc oxide, indium oxide, indium gallium oxide, and aluminium zinc oxide.

Although not shown in FIG. 3, the first through third anodes 101, 102, and 103 may be electrically connected to first through third thin film transistors (not shown) respectively located between the substrate 100 and the first through third anodes 101, 102, and 103.

Figure 4A:
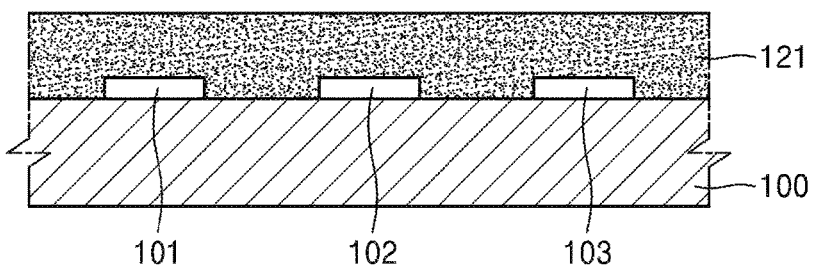
FIGS. 4A, 4B, 4C, 4D, 4E, and 4F are schematic cross-sectional views for describing a first unit process of the method according to an embodiment.

Referring to FIG. 4A, a first lift-off layer 121 including a fluoropolymer may be formed over the substrate 100 in which the first through third anodes 101, 102, and 103 are formed.

The fluoropolymer included in the first lift-off layer 121 may include a polymer containing a content of fluorine ranging from about 20 wt % to about 60 wt %. For example, the fluoropolymer included in the first lift-off layer 121 may include at least one of polytetrafluoroethylene, polychlorotrifluoroethylene, polydichlorodifluoroethylene, a copolymer of chlorotrifluoroethylene and dicholorodifluoroethylene, a copolymer of tetrafluoroethylene and perfluoroalkylvinylether, a copolymer of chlorotrifluoroethylene and perfluoroalkylvinylether, a copolymer of tetrafluoroethylene and perfluoroalkylvinylether, and copolymer of chlorotrifluoroethylene and perfluoroalkylvinylether.

The first lift-off layer 121 may be formed over the substrate 100 by using a coating method, a printing method, or a deposition method. When the first lift-off layer 121 is formed by the coating method and the printing method, a process of forming a photoresist may be performed after performing a hardening process and a polymerization process on the first lift-off layer 121, if necessary.

The first lift-off layer 121 may have a thickness ranging from about 0.2 μm to about 5 μm. If the first lift-off layer 121 is too thick, a time taken to melt the first lift-off layer 121 for a patterning process increases, and thus a manufacturing process time may increase. If the first lift-off layer 121 is too thin, it is difficult to lift off the first lift-off layer 121.

Figure 4B:
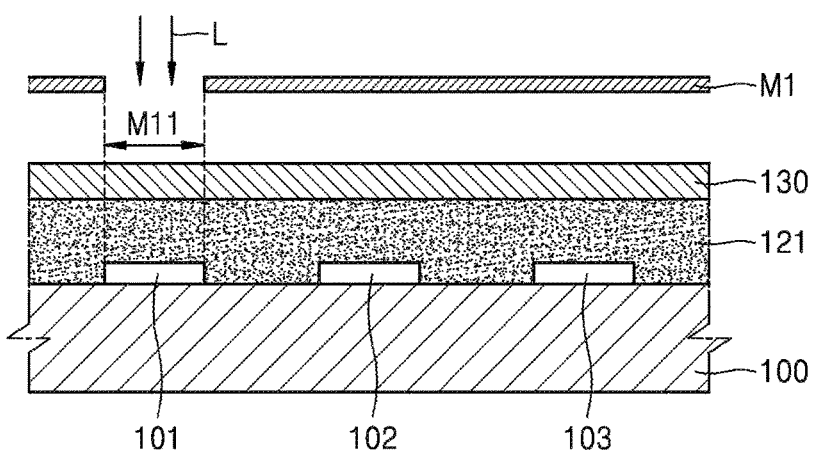

Referring to FIG. 4B, a photoresist 130 may be formed over the first lift-off layer 121. The photoresist 130 at a location corresponding to the first anode 101 may be exposed through a first photomask M1 including a region M11 through which light L transmits. Next, the exposed photoresist 130 may be developed.

Figure 4C:
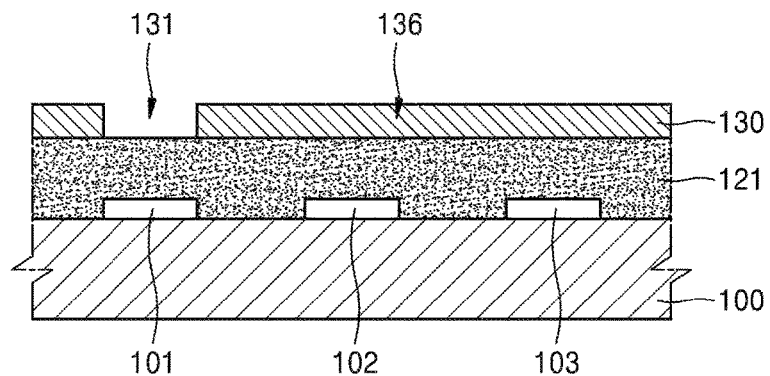

FIG. 4C illustrates a shape of the photoresist 130 that is patterned. In the exposed and developed photoresist 130, a first region 131 at a location corresponding to the first anode 101 may be removed and a region 136 may remain.

Figure 4D:
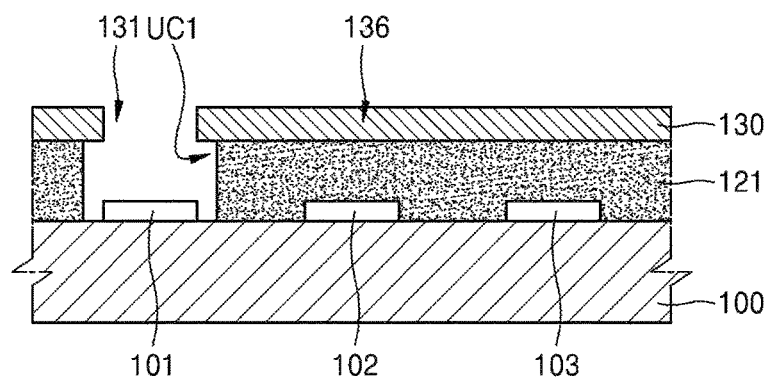

Referring to FIG. 4D, the first lift-off layer 121 may be etched by using the patterned photoresist 130 of FIG. 4C as an etching mask.

Since the first lift-off layer 121 includes fluoropolymer, an etchant may be a solvent capable of etching fluoropolymer.

The etchant may be a first solvent including fluorine. The first solvent may include hydrofluoroether. The hydrofluoroether is an electrochemically stabilized material having a low interaction with other materials and is an eco-friendly material having a low global warming potential (GWP) and a low toxicity.

Through an etching process, the first lift-off layer 121 at a location corresponding to the first region 131, i.e., formed above the first anode 101, may be etched.

When the first lift-off layer 121 is etched, the first solvent including the fluorine may form a first undercut profile UC1 in the first lift-off layer 121 under an interface between the photoresist 130 and the first region 131.

The first undercut profile UC1 may enable a precise deposition pattern of a first organic emission layer 151, sometimes called a first organic functional layer 151 (FIG. 4E), during a deposition process that will be described later and may clearly remove the first lift-off layer 121 that remains on the substrate 100 during a first lift-off process that will be described later.

Figure 4E:
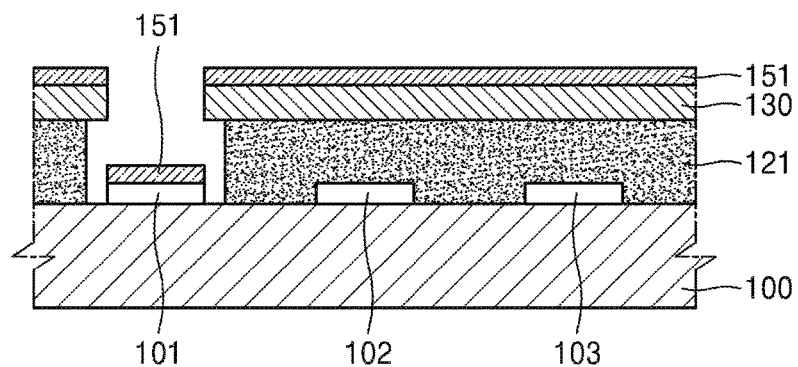

Referring to FIG. 4E, the first organic functional layer 151 including a first organic emission layer may be formed over the structure of FIG. 4D.

The first organic functional layer 151 may further include at least one of a hole injection layer, a hole transport layer, an electron transport layer, and an electron injection layer.

In the present embodiment, the first organic emission layer is used as an example of the first organic function layer 151. Hereinafter, the first organic functional layer and the first organic emission layer may be denoted by the same reference numeral 151.

The first organic emission layer 151 may be formed by a vacuum deposition process. During the deposition process, the first lift-off layer 121 and the photoresist 130 may function as a mask. A part of the first organic emission layer 151 may be formed over the first anode 101 and the other part of the first organic emission layer 151 may be formed over the region 136 (FIG. 4D) of the photoresist 130 except the first region 131.

Figure 4F:
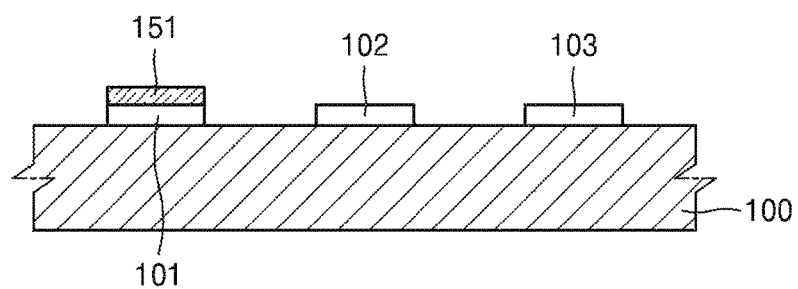

Referring to FIG. 4F, a lift-off process may be performed on the structure of FIG. 4E.

Since the first lift-off layer 121 includes fluoropolymer, a second solvent including fluorine may be used during the lift-off process. Since the lift-off process is performed after forming the first organic emission layer 151, the second solvent may include a material having a low degree of reactivity with the first organic emission layer 151. The second solvent may include hydrofluoroether like the first solvent.

By lifting off the first lift-off layer 121 formed below the region 136 (FIG. 4D) of the photoresist 130, the first organic layer 151 formed over the region 136 (FIG. 4D) of the photoresist 130 may be removed, and the first organic emission layer 151 formed over the first anode 101 may remain as a pattern.

According to the present embodiment, a process of forming the first organic emission layer 151 may prevent a misalignment between the substrate 100 and a metal mask since the first organic emission layer 151 is not deposited by using the metal mask having openings but is formed by using the first lift-off process.

After performing the above-described first unit process, a second unit process of forming a second organic emission layer 152 (see FIG. 5E) that emits light of a different color from the first organic emission layer 151 may be performed on a region in which the second anode 102 is located.

Hereinafter, the second unit process will be described with reference to FIGS. 5A through 5F.

Figure 5A:
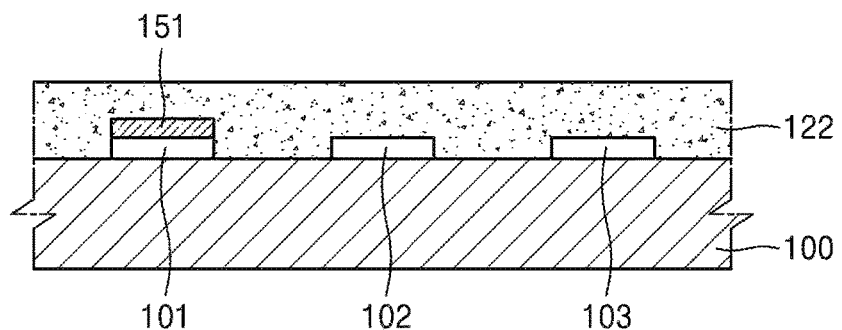
FIGS. 5A, 5B, 5C, 5D, 5E, and 5F are schematic cross-sectional views for describing a second unit process of the method according to an embodiment.

Referring to FIG. 5A, the second lift-off layer 122 including fluoropolymer and a moisture absorbent may be formed over the substrate 100 in which the first through third anodes 101, 102, and 103 are formed.

Unlike the first unit process, the second lift-off layer 122 may further include the moisture absorbent besides fluoropolymer. The moisture absorbent may acquire oxygen and moisture that pass through the second lift-off layer 122 and prevent deterioration of the first organic emission layer 151 formed during the first unit process.

FIGS. 7A through 7D are schematic cross-sectional views for describing a part of a second unit process of a method according to a comparison example.

Figure 7A:
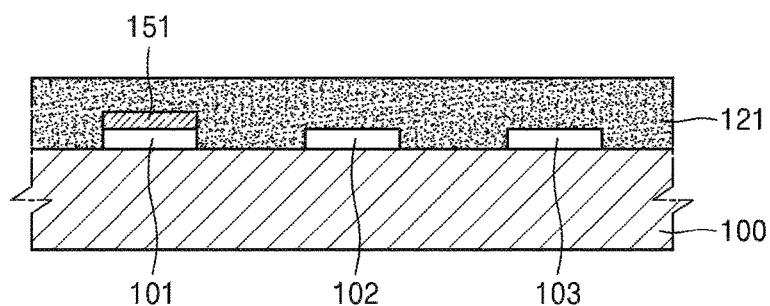
FIGS. 7A, 7B, 7C, and 7D are schematic cross-sectional views for describing a part of a second unit process of a method according to a comparison example.
Figure 7B:
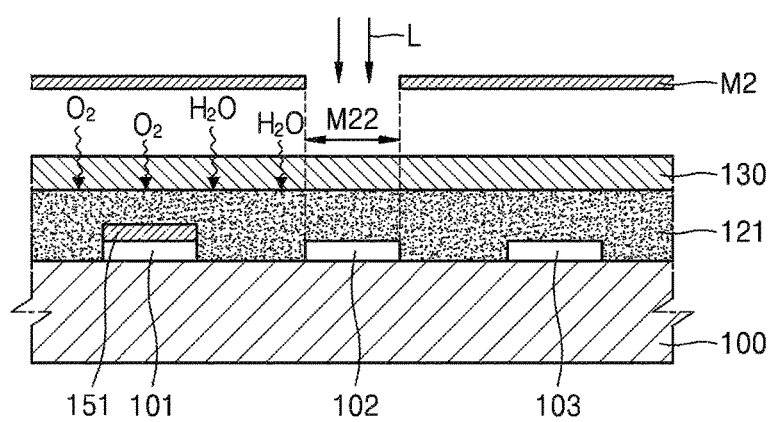
Figure 7C:
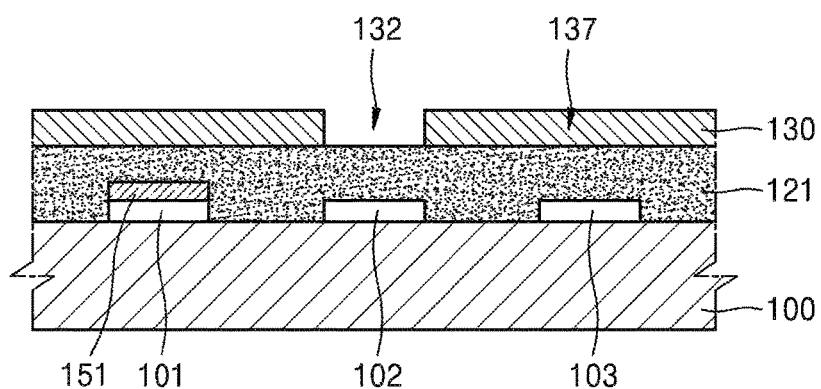
Figure 7D:
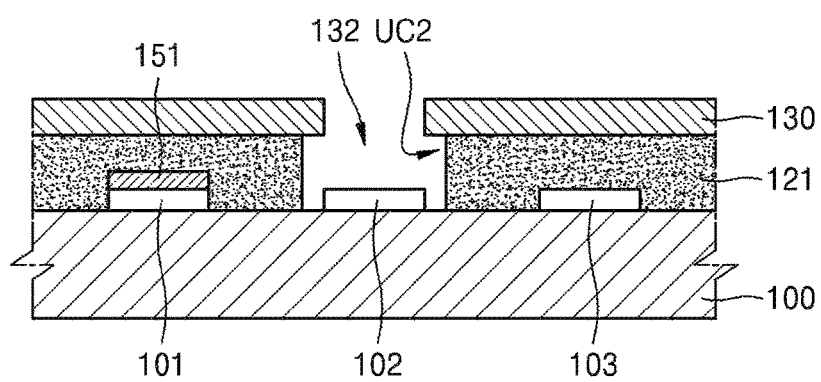

Referring to FIG. 7A, like the first unit process, the first lift-off layer 121 including fluoropolymer may be formed over the substrate 100 on which the first unit process is finished. The first lift-off layer 121 may not include a moisture absorbent. Referring to FIGS. 7B and 7C, the photoresist 130 may be formed over the first lift-off layer 121, and then the photoresist 130 may be patterned through a photolithography process using a photomask M2. Referring to FIG. 7D, the first lift-off layer 121 formed above the second anode 102 may be etched through an etching process.

During the photolithography process and the etching process, an upper surface of the first lift-off layer 121 may contact the photoresist 130 and moisture and oxygen that are generated in a photolithography process environment may be transferred to the first lift-off layer 121, see FIG. 7B for example. The moisture and oxygen transferred to the first lift-off layer 121 may be diffused, which deteriorates the first organic emission layer 151 formed during the first unit process.

However, referring again to FIG. 5A, the second lift-off layer 122 further includes not only the moisture absorbent but also fluoropolymer in the present embodiment, and thus oxygen and moisture that are infiltrated into the second lift-off layer 122 may be acquired during the photolithography process and the etching process. Thus, the present embodiment may prevent deterioration of the first organic emission layer 151 vulnerable to oxygen and moisture which is already formed during the first unit process. The photolithography process may also be possible in the atmosphere, and thus an equipment manufacture may be easy.

The moisture absorbent included in the second lift-off layer 122 may include various materials. The moisture absorbent may include a material, such as calcium oxide, calcium oxide, aluminum oxide, magnesium oxide, etc., that is a compound in which metals are connected to each other via oxygen and that reacts with water and forms metal hydroxide. The moisture absorbent may include one selected from the group consisting of metal halide, metal inorganic acid salt, metal organic acid salt, a porous inorganic compound, and a combination thereof. The moisture absorbent may include acrylic-, methacrylic-, polyisoprene-, vinyl-, epoxy-, urethane-, and cellulose-based organic materials. The moisture absorbent may include titanium, silicon oxide, zirconia, and an alumina-based inorganic material. The moisture absorbent may include a silane manufactured from epoxy silane, vinyl silane, amine silane, and methacrylate silane.

The second lift-off layer 122 including fluoropolymer and the moisture absorbent may be formed over the substrate 100 by using a method such as a coating method, a printing method, a deposition method, etc.

Figure 5B:
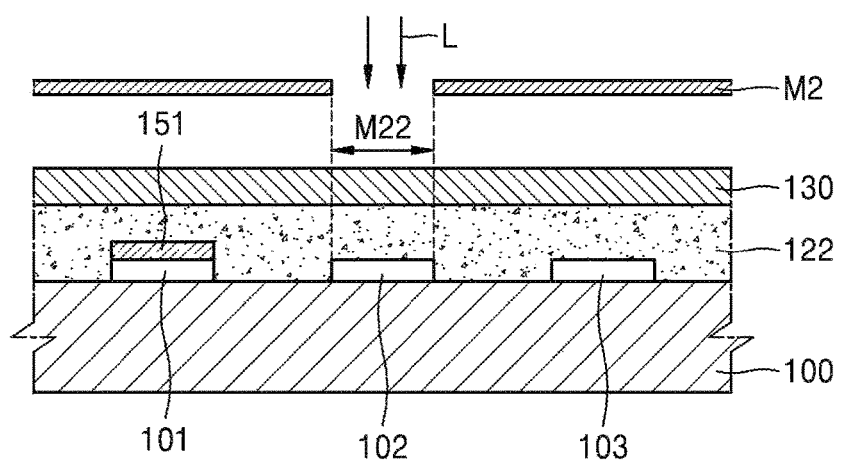

Referring to FIG. 5B, the photoresist 130 may be formed over the second lift-off layer 122. The photoresist 130 at a location corresponding to the second anode 102 may be exposed through a second photomask M2 including a region M22 through which the light L transmits. Next, the exposed photoresist 130 may be developed.

Figure 5C:
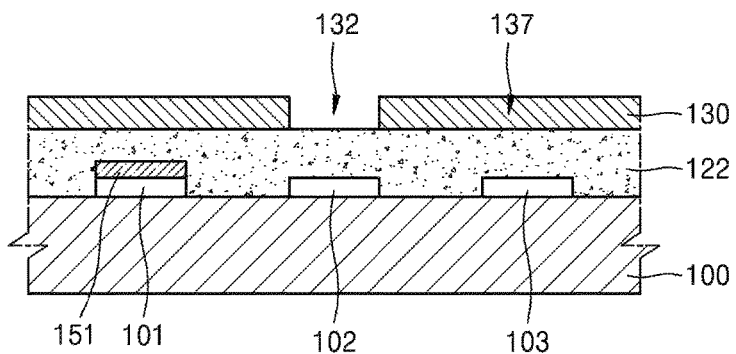

FIG. 5C illustrates a shape of the photoresist 130 that is patterned. In the exposed and developed photoresist 130, a second region 132 at a location corresponding to the second anode 102 may be removed and a region 137 may remain.

Figure 5D:
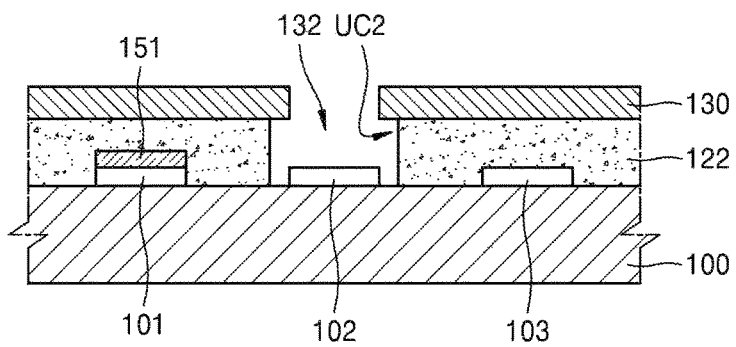

Referring to FIG. 5D, the second lift-off layer 122 may be etched by using the patterned photoresist 130 of FIG. 5C as an etching mask.

Since the second lift-off layer 122 includes fluoropolymer, an etchant may be a solvent capable of etching fluoropolymer. The etchant may be a first solvent including fluorine. The first solvent may include hydrofluoroether like the above-described first unit process. In another embodiment, the first solvent may use a different material from that of the above-described first unit process.

Through an etching process, the second lift-off layer 122 at a location corresponding to the second region 132, i.e., formed above the second anode 102, may be etched.

When the second lift-off layer 122 is etched, the first solvent including the fluorine may form a second undercut profile UC2 in the second lift-off layer 122 under an interface between the photoresist 130 and the second region 132.

Figure 5E:
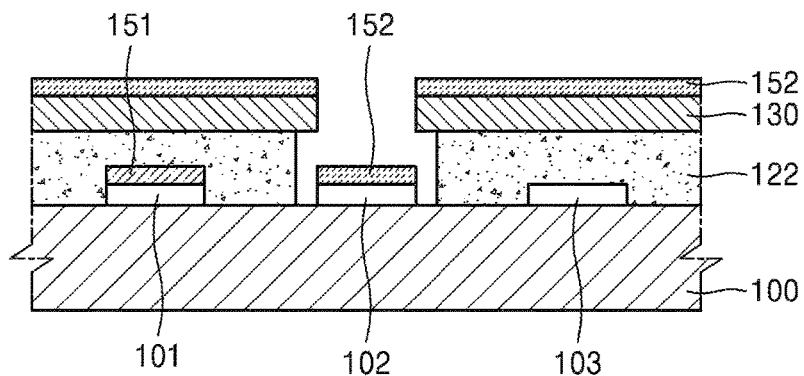

Referring to FIG. 5E, a second organic functional layer 152 including a second organic emission layer may be formed over the structure of FIG. 5D.

The second organic functional layer 152 may further include at least one of a hole injection layer, a hole transport layer, an electron transport layer, and an electron injection layer.

In the present embodiment, the second organic emission layer is used as an example of the second organic functional layer 152. Hereinafter, the second organic functional layer and the second organic emission layer may be denoted by the same reference numeral 152.

The second organic functional layer 152 may be formed by a vacuum deposition process. During the deposition process, the second lift-off layer 122 and the photoresist 130 may function as a mask. A part of the second organic functional layer 152 may be formed over the second anode 102 and the other part of the second organic functional layer 152 may be formed over the region 137 (FIG. 5C) of the photoresist 130 except the second region 132.

Figure 5F:
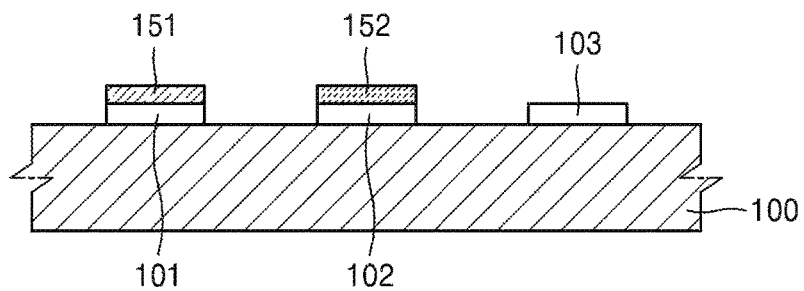

Referring to FIG. 5F, a lift-off process may be performed on the structure of FIG. 5E.

Since the second lift-off layer 122 includes fluoropolymer, a second solvent including fluorine may be used during the lift-off process. Since the lift-off process is performed after forming the second organic functional layer 152, the second solvent may include a material having a low degree of reactivity with the second organic functional layer 152. The second solvent may include hydrofluoroether like the first solvent.

By lifting off the second lift-off layer 122 formed below the region 137 (FIG. 5C) of the photoresist 130, the second lift-off layer 122 formed over the region 137 (FIG. 5C) of the photoresist 130 may be removed, and the second organic functional layer 152 formed over the second anode 102 may remain as a pattern.

After performing the above-described second unit process, a third unit process of forming a third organic emission layer 153 (see FIG. 6F) that emits light of a different color from the first organic emission layer 151 and the second organic functional layer 152 may be performed on a region in which the third anode 103 is located. Hereinafter, the third unit process will be described with reference to FIGS. 6A through 6F.

Figure 6A:
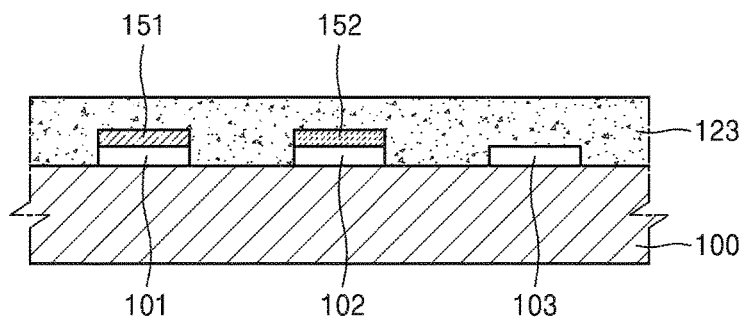
FIGS. 6A, 6B, 6C, 6D, 6E, and 6F are schematic cross-sectional views for describing a third unit process of the method according to an embodiment.

Referring to FIG. 6A, a third lift-off layer 123 including fluoropolymer and a moisture absorbent may be formed over the substrate 100 in which the first through third anodes 101, 102, and 103 are formed.

Like the second unit process, the third lift-off layer 123 may include the moisture absorbent, thereby acquiring oxygen and moisture that are infiltrated into the third lift-off layer 123 during a photolithography process and an etching process. Thus, deterioration of the first organic emission layer 151 formed during the first unit process and the second organic emission layer 152 formed during the second unit process may be prevented.

The third lift-off layer 123 may include the same material, e.g., the same fluoropolymer and moisture absorbent, that is used in the second unit process. The third lift-off layer 123 may be formed over the substrate 100 by using a method of a coating method, a printing method, a deposition method, etc.

Figure 6B:
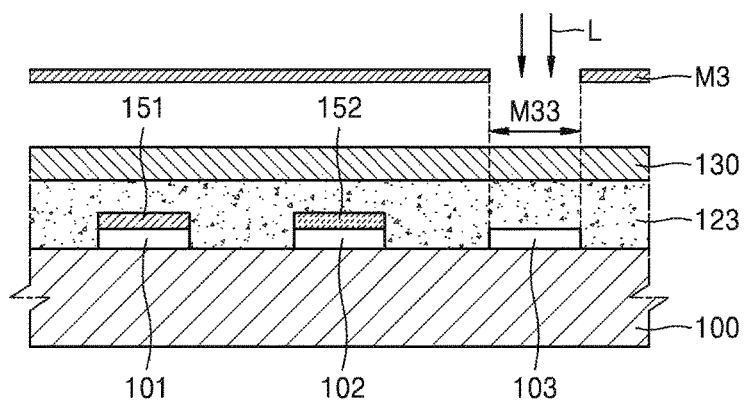

Referring to FIG. 6B, the photoresist 130 may be formed over the third lift-off layer 123. The photoresist 130 at a location corresponding to the third anode 103 may be exposed through a third photomask M3 including a region M33 through which the light L transmits. Next, the exposed photoresist 130 may be developed.

Figure 6C:
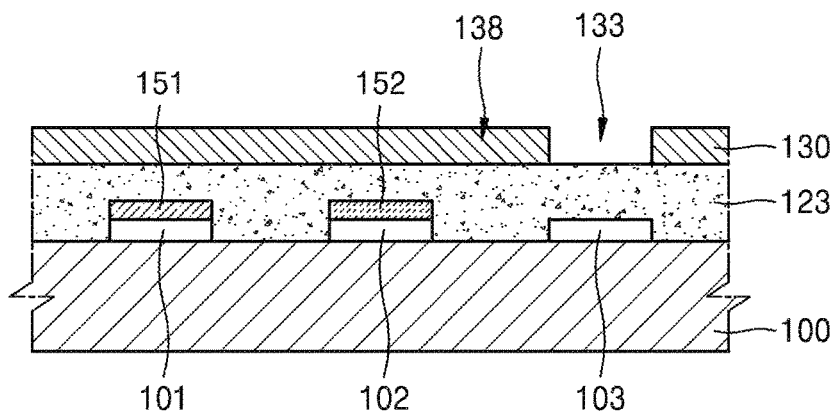

FIG. 6C illustrates a shape of the photoresist 130 that is patterned. In the exposed and developed photoresist 130, a third region 133 at a location corresponding to the third anode 103 may be removed and a region 138 may remain.

Figure 6D:
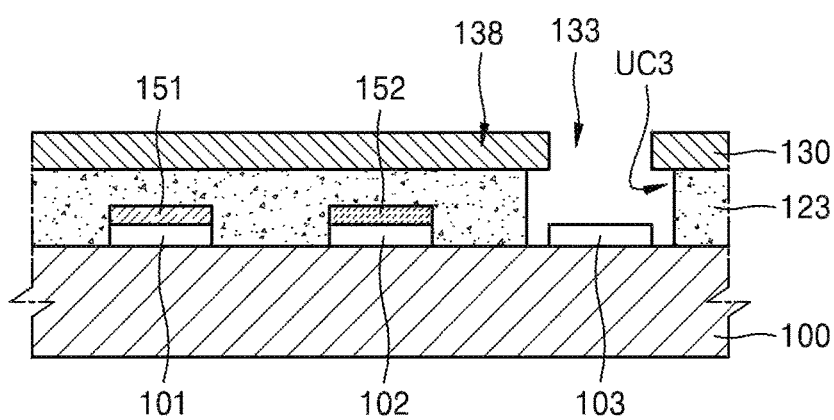

Referring to FIG. 6D, the third lift-off layer 123 may be etched by using the patterned photoresist 130 of FIG. 6C as an etching mask.

Since the third lift-off layer 123 includes fluoropolymer, an etchant may be a solvent capable of etching fluoropolymer. The etchant may be a first solvent including fluorine. The first solvent may include hydrofluoroether like the above-described first unit process. In another embodiment, the first solvent may use a different material from that of the above-described first unit process.

Through an etching process, the third lift-off layer 123 at a location corresponding to the third region 133, i.e., formed above the third anode 103, may be etched.

When the third lift-off layer 123 is etched, the first solvent including the fluorine may form a third undercut profile UC3 in the third lift-off layer 123 under an interface between the photoresist 130 and the third region 133.

Figure 6E:
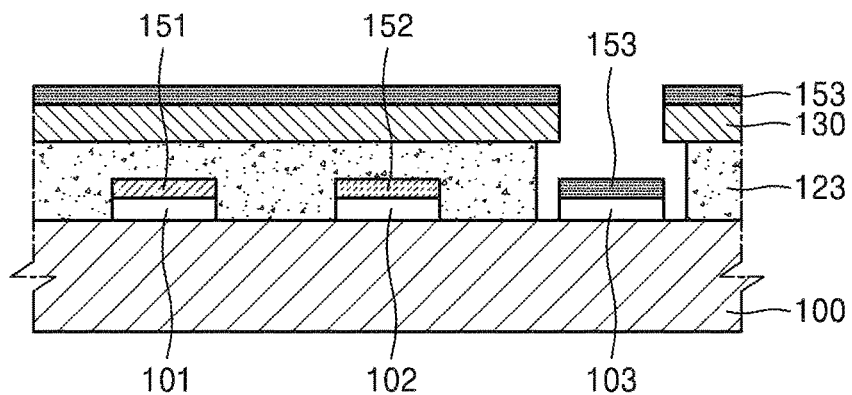

Referring to FIG. 6E, the third organic functional layer 153 including a third organic emission layer may be formed over the structure of FIG. 6D.

The third organic functional layer 153 may further include at least one of a hole injection layer, a hole transport layer, an electron transport layer, and an electron injection layer.

In the present embodiment, the third organic emission layer is used as an example of the third organic functional layer 153. Hereinafter, the third organic functional layer and the third organic emission layer may be denoted by the same reference numeral 153.

The third organic functional layer 153 may be formed by a vacuum deposition process. During the deposition process, the third lift-off layer 123 and the photoresist 130 may function as a mask. A part of the third organic functional layer 153 may be formed over the third anode 103 and the other part of the third organic functional layer 153 may be formed over the region 138 (FIG. 6D) of the photoresist 130 except the third region 133.

Figure 6F:
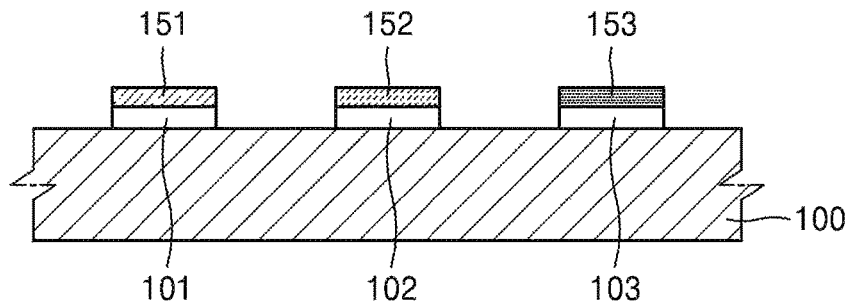

Referring to FIG. 6F, a lift-off process may be performed on the structure of FIG. 6E.

Since the third lift-off layer 123 includes fluoropolymer, a third solvent including fluorine may be used during the lift-off process. Since the lift-off process is performed after forming the third organic functional layer 153, the third solvent may include a material having a low degree of reactivity with the third organic functional layer 153. The third solvent may include hydrofluoroether like the first solvent.

By lifting off the third lift-off layer 123 formed below the region 138 (FIG. 6D) of the photoresist 130, the third organic functional layer 153 formed over the region 138 (FIG. 6D) of the photoresist 130 may be removed, and the third organic functional layer 153 formed over the third anode 103 may remain as a pattern.

Referring to FIG. 2, after forming the first through third organic functional layers 151, 152, and 153 through the above-described first through third unit processes, a cathode 180 may be formed as a common layer.

In the present embodiment, the first through third anodes 101, 102, and 103, sometimes called first electrodes, are described as hole injection layers, and the cathode 180, sometimes called a second electrode, is described as an electron injection layer but this is an example. Electron injection electrodes may be formed in regions in which the first through third anodes 101, 102, and 103 are formed, and a hole injection electrode may be formed in a region in which the cathode 180 is located.

The first through third organic emission layers 151, 152, and 153 may emit light of different colors. The light emitted from the first through third organic emission layers 151, 152, and 153 may be mixed to form white light. For example, the first through third organic emission layers 151, 152, and 153 may respectively emit red light, green light, and blue light. For example, the first through third organic emission layers 151, 152, and 153 may be sub-pixels configuring a unit pixel of the organic light-emitting display apparatus 1.

The organic light-emitting display apparatus 1 shown in FIG. 2 may indicate one unit pixel. The present embodiment may be applied to an organic light-emitting display apparatus including a plurality of unit pixels shown in FIG. 2. That is, a plurality of first organic emission layers 151 that emit first color light may be formed simultaneously through the first unit process. A plurality of second organic emission layers 152 that emit second color light may be simultaneously formed through the second unit process. A plurality of third organic emission layers 153 that emit third color light may be simultaneously formed through the third unit process. Full-color light may be implemented through the first through third unit processes.

FIGS. 8A through 8E are schematic cross-sectional views for describing a second unit process of a method according to another embodiment.

Figure 8A:
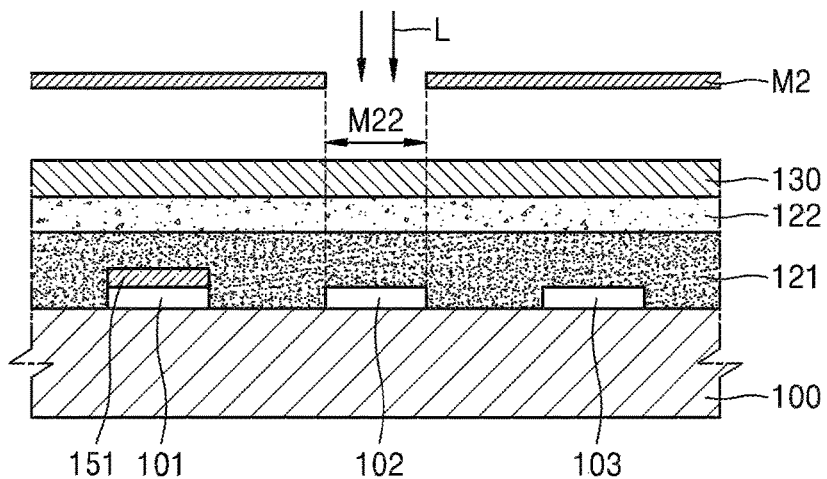
FIGS. 8A, 8B, 8C, 8D, and 8E are schematic cross-sectional views for describing a second unit process of a method according to another embodiment.

Referring to FIG. 8A, a first lift-off layer 121 including fluoropolymer may be formed over the substrate 100 in which a first unit process is finished, and a second lift-off layer 122 including fluoropolymer and a moisture absorbent may be formed on the first lift-off layer 121.

The photoresist 130 may be formed on the second lift-off layer 122. The photoresist 130 at a location corresponding to the second anode 102 may be exposed through the second photomask M2 including the region M22 through which light L transmits. Next, the exposed photoresist 130 may be developed.

The second lift-off layer 122 including the moisture absorbent may be formed in a location contacting the photoresist 130, thereby acquiring oxygen and moisture that are infiltrated into the second lift-off layer 122 during a photolithography process and an etching process. Thus, deterioration of the first organic emission layer 151 formed during the first unit process may be prevented.

Figure 8B:
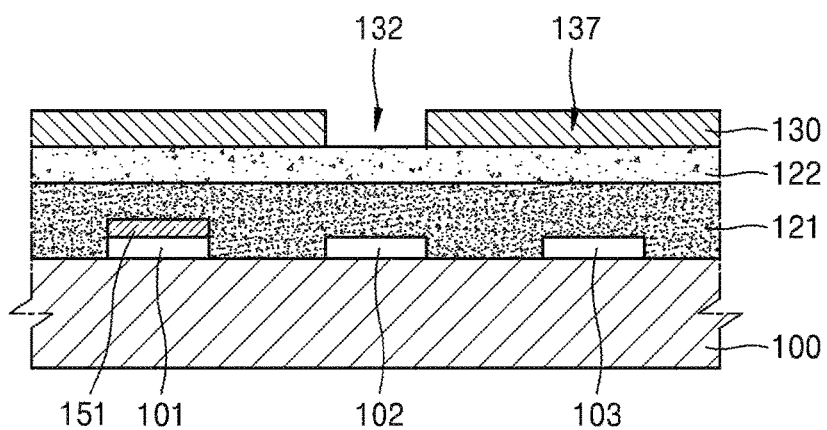

FIG. 8B illustrates a shape of the photoresist 130 that is patterned. In the exposed and developed photoresist 130, the second region 132 at a location corresponding to the second anode 102 may be removed and the region 137 may remain.

Figure 8C:
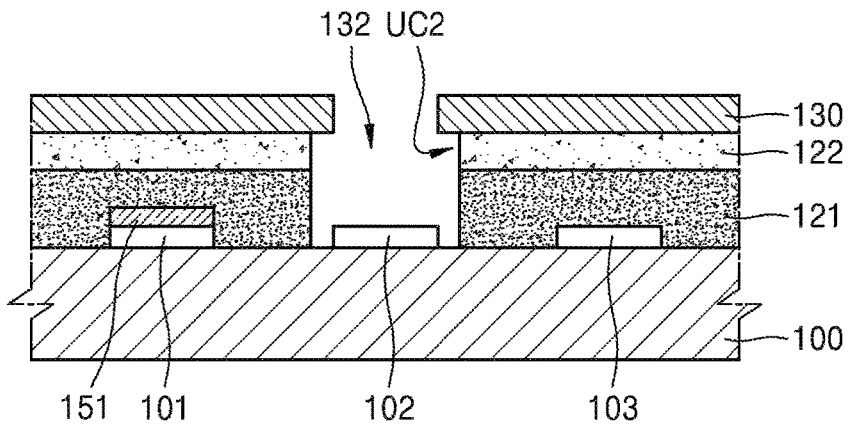

Referring to FIG. 8C, the first lift-off layer 121 and the second lift-off layer 122 may be etched by using the patterned photoresist 130 of FIG. 8B as an etching mask.

Since both the first lift-off layer 121 and the second lift-off layer 122 include fluoropolymer, an etchant may be a solvent capable of etching fluoropolymer. The etchant may be a first solvent including fluorine. The first solvent may include hydrofluoroether like the above-described first unit process. The first solvent may use a different material from that of the above-described first unit process.

Through an etching process, the first lift-off layer 121 and the second lift-off layer 122 at a location corresponding to the second region 132, i.e., formed above the second anode 102, may be etched.

When the first lift-off layer 121 and the second lift-off layer 122 are etched, the first solvent including the fluorine may form the second undercut profile UC2 in the second lift-off layer 122 under an interface between the photoresist 130 and the second region 132.

Figure 8D:
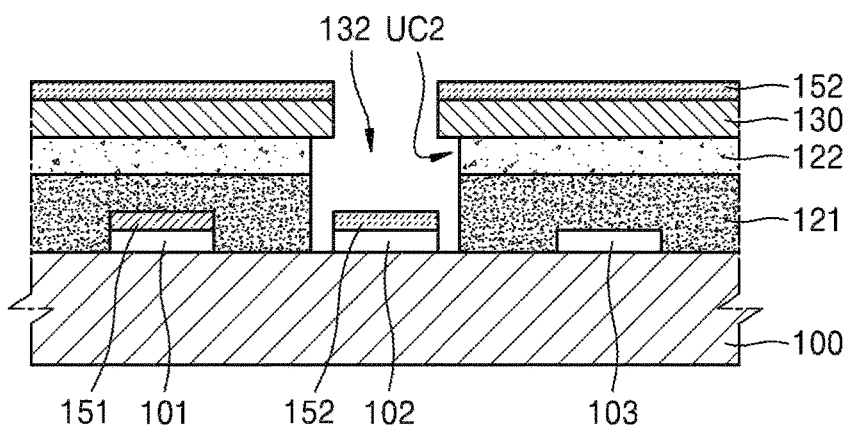

Referring to FIG. 8D, the second organic functional layer 152 including a second organic emission layer may be formed over the structure of FIG. 8C.

The second organic functional layer 152 may further include at least one of a hole injection layer, a hole transport layer, an electron transport layer, and an electron injection layer.

In the present embodiment, the second organic emission layer is used as an example of the second organic functional layer 152. Hereinafter, the second organic functional layer and the second organic emission layer may be denoted by the same reference numeral.

The second organic functional layer 152 may be formed by a vacuum deposition process. During the deposition process, the first lift-off layer 121 and the second lift-off layer 122 and the photoresist 130 may function as a mask. A part of the second organic functional layer 152 may be formed over the second anode 102 and the other part of the second organic functional layer 152 may be formed over the region 137 (FIG. 8B) of the photoresist 130 except the second region 132.

Figure 8E:
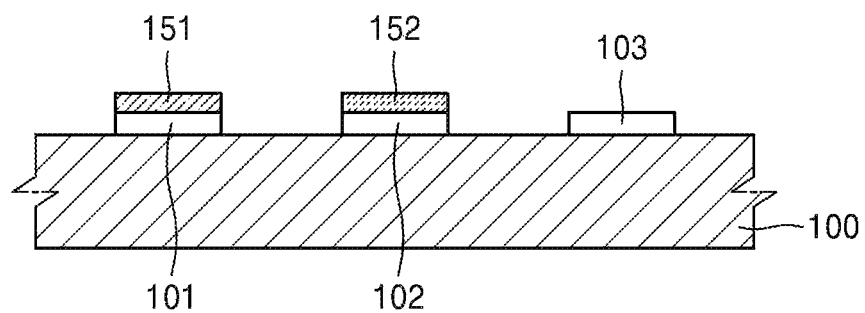

Referring to FIG. 8E, a lift-off process may be performed on the structure of FIG. 8D.

Since the first lift-off layer 121 and the second lift-off layer 122 include fluoropolymer, a second solvent including fluorine may be used during the lift-off process. Since the lift-off process is performed after forming the second organic functional layer 152, the second solvent may include a material having a low degree of reactivity with the second organic functional layer 152. The second solvent may include hydrofluoroether like the first solvent.

By lifting off the first lift-off layer 121 and the second lift-off layer 122 formed below the region 137 (FIG. 8B) of the photoresist 130, the second organic functional layer 152 formed over the region 137 (FIG. 8B) of the photoresist 130 may be removed, and the second organic functional layer 152 formed over the second anode 102 may remain as a pattern.

FIGS. 9A through 9E are schematic cross-sectional views for describing a third unit process of a method according to another embodiment.

Figure 9A:
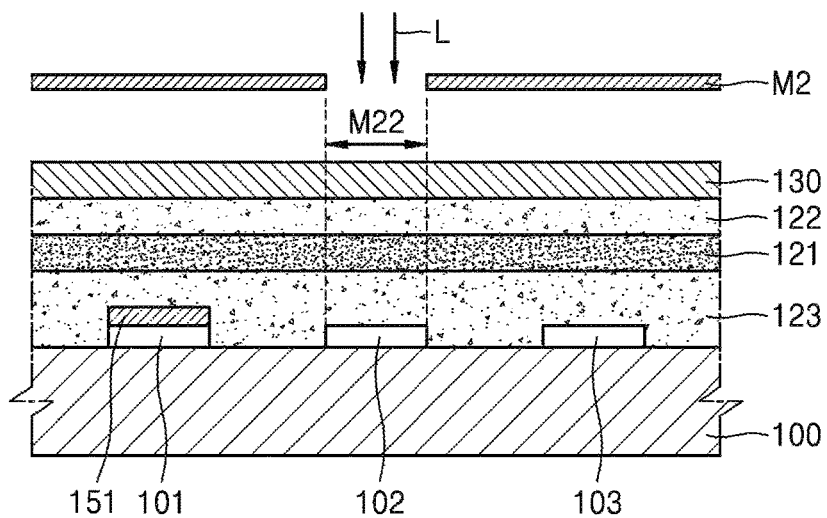
FIGS. 9A, 9B, 9C, 9D, and 9E are schematic cross-sectional views for describing a third unit process of a method according to another embodiment.

Referring to FIG. 9A, the first lift-off layer 121 including fluoropolymer may be formed over the substrate 100 on which a first unit process is finished, the second lift-off layer 122 including fluoropolymer and a moisture absorbent may be formed on the first lift-off layer 121, and the third lift-off layer 123 including fluoropolymer and a moisture absorbent may be formed between the first organic emission layer 151 and the first lift-off layer 121.

The photoresist 130 may be formed over the second lift-off layer 122. The photoresist 130 at a location corresponding to the second anode 102 may be exposed through the second photomask M2 including the region M22 through which the light L transmits. Next, the exposed photoresist 130 may be developed.

The second lift-off layer 122 including the moisture absorbent may be formed in a location contacting the photoresist 130, thereby acquiring oxygen and moisture that are infiltrated into the second lift-off layer 122 during a photolithography process and an etching process. Thus, deterioration of the first lift-off layer 121 may be prevented.

The third lift-off layer 123 including the moisture absorbent may be formed in a location close to the first organic emission layer 151, thereby acquiring oxygen and moisture that are infiltrated into the third lift-off layer 123. Thus, deterioration of the first organic emission layer 151 may be prevented.

Figure 9B:
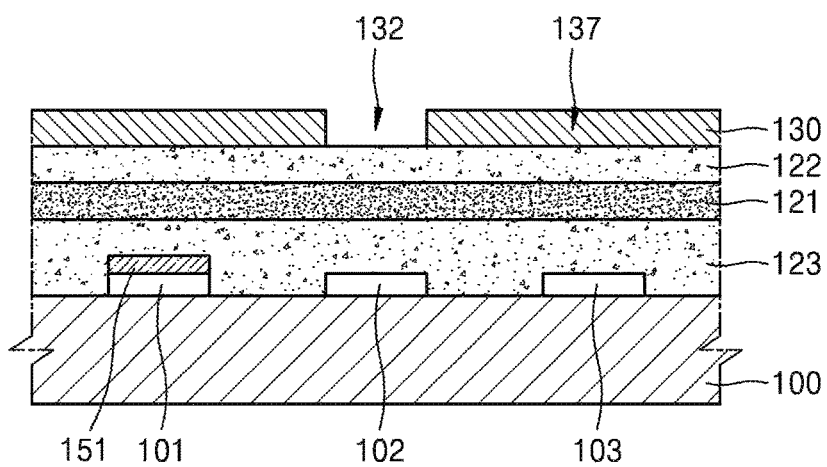

FIG. 9B illustrates a shape of the photoresist 130 that is patterned. In the exposed and developed photoresist 130, the second region 132 at a location corresponding to the second anode 102 may be removed and the region 137 may remain.

Figure 9C:
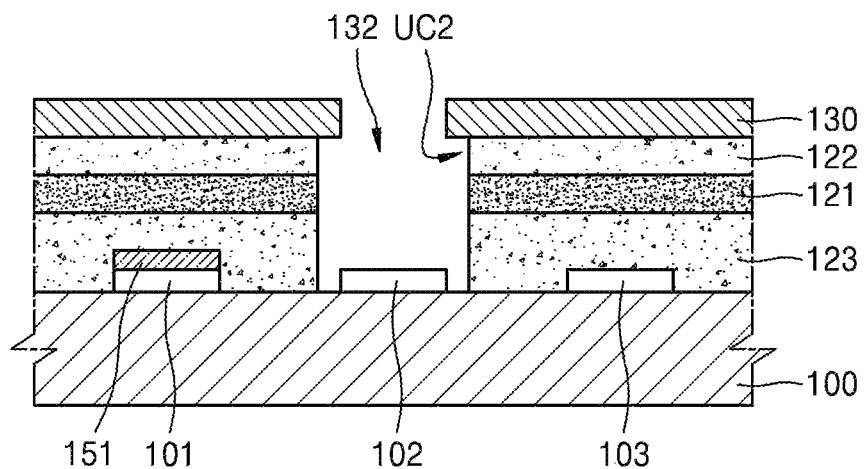

Referring to FIG. 9C, the first lift-off layer 121, the second lift-off layer 122, and the third lift-off layer 123 may be etched by using the patterned photoresist 130 of FIG. 9B as an etching mask.

Since all the first lift-off layer 121, the second lift-off layer 122, and the third lift-off layer 123 include fluoropolymer, an etchant may be a solvent capable of etching fluoropolymer. The etchant may be a first solvent including fluorine. The first solvent may include hydrofluoroether like the above-described first unit process. The first solvent may use a different material from that of the above-described first unit process.

Through an etching process, the first lift-off layer 121, the second lift-off layer 122, and the third lift-off layer 123 at a location corresponding to the second region 132, i.e., formed above the second anode 102, may be etched.

When the first lift-off layer 121, the second lift-off layer 122, and the third lift-off layer 123 are etched, the first solvent including the fluorine may form the second undercut profile UC2 in the second lift-off layer 122 under an interface between the photoresist 130 and the second region 132.

Figure 9D:
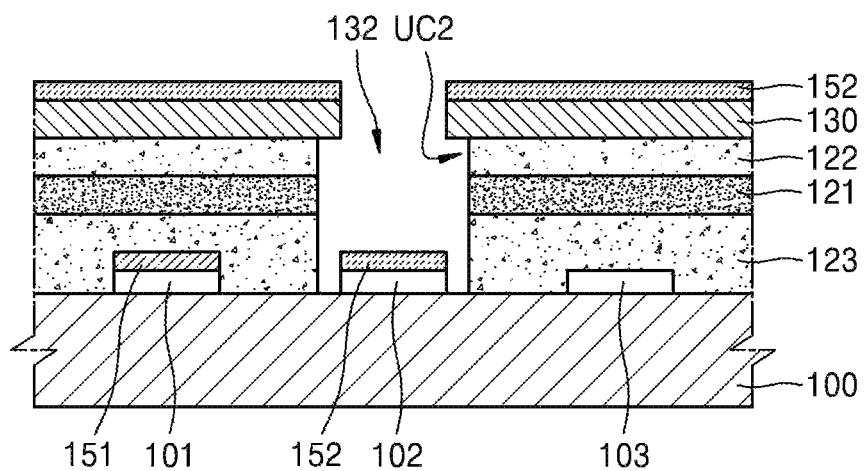

Referring to FIG. 9D, the second organic functional layer 152 including a second organic emission layer may be formed over the structure of FIG. 9C.

The second organic functional layer 152 may further include at least one of a hole injection layer, a hole transport layer, an electron transport layer, and an electron injection layer.

In the present embodiment, the second organic emission layer is used as an example of the second organic functional layer 152. Hereinafter, the second organic functional layer and the second organic emission layer may be denoted by the same reference numeral 152.

The second organic functional layer 152 may be formed by a vacuum deposition process. During the deposition process, the first lift-off layer 121, the second lift-off layer 122, the third lift-off layer 123, and the photoresist 130 may function as a mask. A part of the second organic functional layer 152 may be formed over the second anode 102 and the other part of the second organic functional layer 152 may be formed over the region 137 (FIG. 9B) of the photoresist 130 except the second region 132.

Figure 9E:
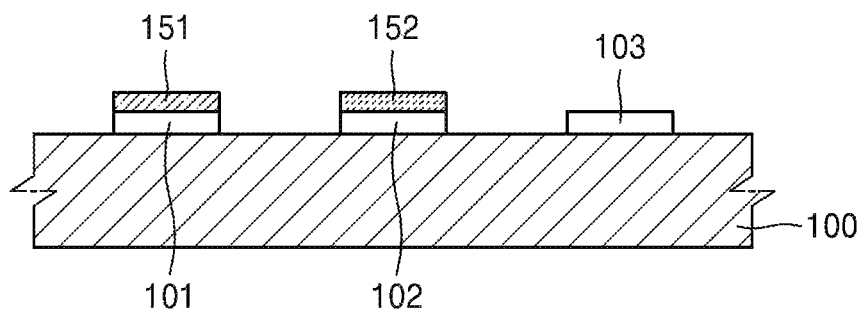

Referring to FIG. 9E, a lift-off process may be performed on the structure of FIG. 9D.

Since all the first lift-off layer 121, the second lift-off layer 122, and the third lift-off layer 123 include fluoropolymer, a second solvent including fluorine may be used during the lift-off process. Since the lift-off process is performed after forming the second organic functional layer 152, the second solvent may include a material having a low degree of reactivity with the second organic functional layer 152. The second solvent may include hydrofluoroether like the first solvent.

By lifting off the first lift-off layer 121, the second lift-off layer 122, and the third lift-off layer 123 formed below the region 137 (FIG. 9B) of the photoresist 130, the second organic functional layer 152 formed over the region 137 (FIG. 9B) of the photoresist 130 may be removed, and the second organic functional layer 152 formed over the second anode 102 may remain as a pattern.

Figure 10:
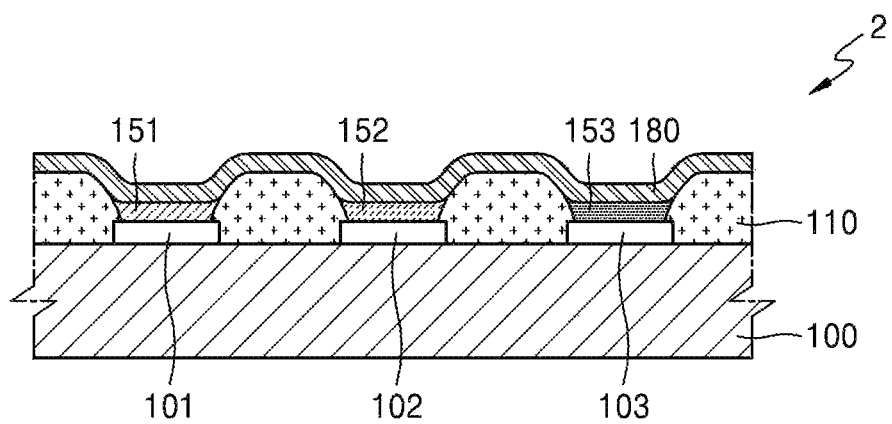
FIG. 10 is a schematic cross-sectional view of an organic light-emitting display apparatus manufactured by using a method according to another embodiment.

FIG. 10 is a schematic cross-sectional view of an organic light-emitting display apparatus 2 manufactured by using a method according to another embodiment.

The organic light-emitting display apparatus 2 of FIG. 10 may be manufactured in a similar manner to that of the organic light-emitting display apparatus 1 of FIG. 2. Hereinafter, differences between the method of manufacturing the organic light-emitting display apparatus 2 of FIG. 10 and the method of manufacturing the organic light-emitting display apparatus 1 of FIG. 2 will be described in brief.

Referring to FIG. 10, a plurality of anodes including the first through third anodes 101, 102, and 103 may be formed over the substrate 100, and a pixel defining layer 110 that surrounds edges of the first through third anodes 101, 102, and 103 may be formed on the substrate 100. The pixel defining layer 110 may define an emission region and prevent disconnections between the first through third anodes 101, 102, and 103 and the cathode 180.

In the present embodiment, first through third unit processes may be performed after forming the first through third anodes 101, 102, and 103 and the pixel defining layer 110.

Through the first through third unit processes, the first through third organic emission layers 151, 152, and 153 may be formed over the first through third anodes 101, 102, and 103. After performing the first through third unit processes, the cathode 180 may be formed as a common layer.

Figure 11:
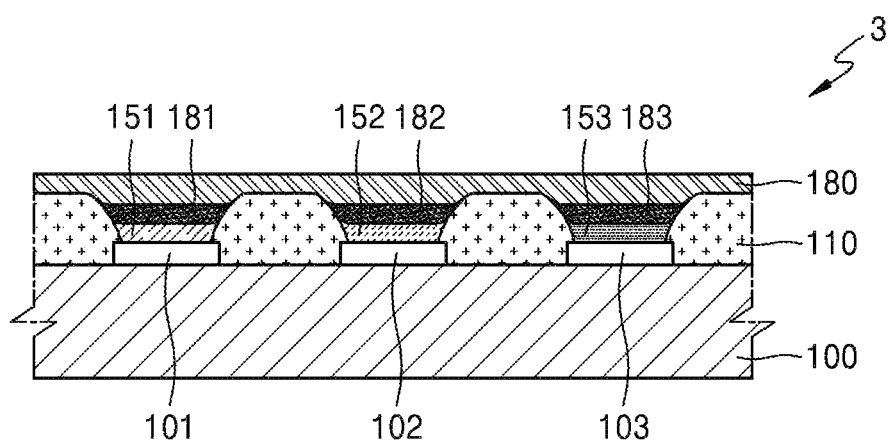
FIG. 11 is a schematic cross-sectional view of an organic light-emitting display apparatus manufactured by using a method according to another embodiment.

FIG. 11 is a schematic cross-sectional view of an organic light-emitting display apparatus 3 manufactured by using a method according to another embodiment.

Referring to FIG. 11, a plurality of anodes including the first through third anodes 101, 102, and 103 may be formed over the substrate 100, and the pixel defining layer 110 that surrounds edges of the first through third anodes 101, 102, and 103 may be formed on the substrate 100. The pixel defining layer 110 may define an emission region and prevent disconnections between the first through third anodes 101, 102, and 103 and the cathode 180.

In the present embodiment, first through third unit processes may be performed after forming the first through third anodes 101, 102, and 103 and the pixel defining layer 110.

During the first unit process, the first lift-off layer 121 including fluoropolymer may be formed (see FIG. 4A) and may be etched by using a first solvent including fluorine (see FIG. 4D). Next, during a deposition process, the first organic emission layer 151 may be formed on the first anode 101. When the first organic emission layer 151 is formed, a first auxiliary cathode 181 may be successively deposited on the first organic emission layer 151, and a lift-off process may be performed.

During the lift-off process, a second solvent including fluorine may be used. The first organic emission layer 151 may be damaged by the second solvent including fluorine. The first auxiliary cathode 181 may function as a barrier for protecting the first organic emission layer 151 during the lift-off process.

After the first unit process, the second unit process may be performed. The second lift-off layer 122 including fluoropolymer and a moisture absorbent may be formed (see FIG. 5A) and may be etched by using a first solvent including fluorine (see FIG. 5D). Next, during a deposition process, the second organic emission layer 152 may be formed on the second anode 102. When the second organic emission layer 152 is formed, a second auxiliary cathode 182 may be successively deposited on the second organic emission layer 152, and a lift-off process may be performed.

During the lift-off process, a second solvent including fluorine may be used. The second organic emission layer 152 may be damaged by the second solvent including fluorine. The second auxiliary cathode 182 may function as a barrier for protecting the second organic emission layer 152 during the lift-off process.

After the second unit process, the third unit process may be performed. The third lift-off layer 123 including fluoropolymer and a moisture absorbent may be formed (see FIG. 6A) and may be etched by using a first solvent including fluorine (see FIG. 6D). Next, during a deposition process, the third organic emission layer 153 may be formed on the third anode 103. When the third organic emission layer 153 is formed, a third auxiliary cathode 183 may be continuously deposited on the third organic emission layer 153, and a lift-off process may be performed.

During the lift-off process, a second solvent including fluorine may be used. The third organic emission layer 153 may be damaged by the second solvent including fluorine. The third auxiliary cathode 183 may function as a barrier for protecting the third organic emission layer 153 during the lift-off process.

The cathode 180 may be formed as the common layer after the first through third unit processes are performed.

According to the manufacturing method of FIG. 11, when the first through third organic emission layers 151, 152, and 153 are formed during each unit process, the first through third auxiliary cathodes 181, 182, and 183 may be successively deposited on the first through third organic emission layers 151, 152, and 153, thereby preventing damage to the first through third organic emission layers 151, 152, and 153 during a subsequent lift-off process. After the first through third unit processes, the first through third auxiliary cathodes 181, 182, and 183 may be electrically connected to the cathode 180 that is commonly formed throughout a plurality of pixels, thereby preventing a voltage drop of the cathode 180.

Although not shown in FIGS. 1 through 11 above, the organic light-emitting display apparatuses described above may further include an encapsulation member for encapsulating an organic emission layer. The encapsulation member may include a glass substrate, a metal foil, or a thin film encapsulation layer in which an inorganic layer and an organic layer are mixed.

According to the one or more embodiments, an emission layer may be formed without a fine metal mask (FMM), thereby simplifying a manufacturing process and preventing a misalignment between patterns.

A lift-off layer may include a moisture absorbent, in addition to fluoropolymer, which prevents deterioration of an organic emission layer due to moisture and oxygen, thereby reducing defects.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A method of manufacturing an organic light-emitting display apparatus, the method comprising:
    forming a first lift-off layer comprising fluoropolymer and a moisture absorbent over a substrate comprising a first electrode;
    forming a second lift-off layer comprising fluoropolymer between the first lift-off layer and the first electrode, wherein of the first lift-off layer and the second lift-off layer, only the first lift-off layer comprises the moisture absorbent;
    forming a photoresist over the first lift-off layer and patterning the photoresist by removing a part of the photoresist;
    etching the first lift-off layer in a region from which the part of the photoresist has been removed by using a first solvent to expose the first electrode;
    forming an organic functional layer comprising an emission layer above the first electrode and above the first lift-off layer;
    removing the first lift-off layer by using a second solvent; and
    forming a second electrode over the organic functional layer,
    wherein the first lift-off layer absorbs moisture in at least one of the steps of the forming the first lift-off layer, the forming and pattering the photoresist, the etching the first lift-off layer, and the forming the organic functional layer.

2. The method of claim 1, wherein the fluoropolymer comprises a content of fluorine ranging from 20 wt % to 60 wt %.

3. The method of claim 1, wherein the organic functional layer further comprises at least one of a hole injection layer, a hole transport layer, an electron transport layer, and an electron injection layer.

4. The method of claim 1, wherein the organic functional layer is formed through a deposition process.

5. The method of claim 1, wherein the patterning by removing the part of the photoresist is performed through a photolithography process.

6. The method of claim 1, wherein the first solvent comprises fluorine.

7. The method of claim 1, wherein the second solvent comprises fluorine.

8. The method of claim 1, wherein, after the etching the first lift-off layer in the region from which the photoresist has been removed, the first lift-off layer forms an undercut profile under a region in which the photoresist remains.

9. The method of claim 1, further comprising forming a pixel defining layer that surrounds an edge of the first electrode.

10. The method of claim 1, further comprising:
    forming a third lift-off layer comprising fluoropolymer and a moisture absorbent between the second lift-off layer and the first electrode.

11. The method of claim 1, further comprising forming an auxiliary cathode in the forming of the organic functional layer before forming the second electrode.

12. A method of manufacturing an organic light-emitting display apparatus, the method comprising:
    forming a plurality of first electrodes over a substrate and performing a first unit process comprising following operations (a1) through (e1);
    (a1) forming a first lift-off layer comprising fluoropolymer over the substrate comprising the plurality of first electrodes;
    (b1) forming a photoresist over the first lift-off layer and patterning the photoresist by removing a part of the photoresist;
    (c1) etching the first lift-off layer in a region from which the photoresist has been removed by using a first solvent to expose a predetermined first electrode selected from the plurality of first electrodes;
    (d1) forming a first organic functional layer comprising an emission layer above the predetermined first electrode and above the first lift-off layer;
    (e1) removing the first lift-off layer by using a second solvent;
    after performing the first unit process, performing a second unit process comprising following operations (a2) through (e2) at least one time;
    (a2) forming a second lift-off layer comprising fluoropolymer and a moisture absorbent over the substrate comprising the plurality of first electrodes, wherein of the first lift-off layer and the second lift-off layer, only the second lift-off layer comprises the moisture absorbent;
    (b2) forming a photoresist over the second lift-off layer and patterning the photoresist by removing a part of the photoresist;
    (c2) etching the second lift-off layer in a region from which the photoresist has been removed by using the first solvent to expose a first electrode different from the predetermined first electrode selected during the first unit process;
    (d2) forming a second organic functional layer comprising an emission layer above the first electrode and above the second lift-off layer;
    (e2) removing the second lift-off layer by using the second solvent; and
    after performing the first unit process and the second unit process, forming a second electrode,
    wherein the second lift-off layer absorbs moisture in at least one of the steps of the forming the second lift-off layer, the forming and pattering the photoresist over the second lift-off layer, the etching the second lift-off layer, and the forming the second organic functional layer.

13. The method of claim 12, wherein light emitted from the first and second organic functional layers respectively formed during the first unit process and the second unit process is mixed to generate white light.

14. The method of claim 12, further comprising during the second unit process, forming a third lift-off layer comprising fluoropolymer between the second lift-off layer and the first organic functional layer.

15. The method of claim 14, further comprising during the second unit process, forming a fourth lift-off layer comprising fluoropolymer and a moisture absorbent between the third lift-off layer and the first organic functional layer.

16. The method of claim 12, wherein the second electrode is integrally formed on the first and second organic functional layers as a common electrode.

17. The method of claim 16, further comprising forming an auxiliary cathode in the forming of the first and second organic functional layer of the first and second unit process before forming the second electrode.

18. The method of claim 12, further comprising forming a pixel defining layer that surrounds an edge of the first electrode.

19. An organic light-emitting display apparatus manufactured by using the method of claim 12.

* * * * *